United States Patent [19]

Budd

[11] Patent Number: 5,418,062
[45] Date of Patent: May 23, 1995

[54] ENCAPSULATED ELECTROLUMINESCENT PHOSPHOR PARTICLES

[75] Inventor: Kenton D. Budd, Woodbury, Minn.

[73] Assignee: Minnesota Mining and Manufacturing Company, St. Paul, Minn.

[21] Appl. No.: 912,786

[22] Filed: Jul. 13, 1992

Related U.S. Application Data

[62] Division of Ser. No. 514,440, Apr. 25, 1990, Pat. No. 5,156,885.

[51] Int. Cl.$^6$ ............................................. B32B 5/16
[52] U.S. Cl. .............................. 428/403; 252/301.6 R; 252/301.4 S; 427/248.1; 427/255.3; 428/404; 428/690; 428/917
[58] Field of Search ............... 428/403, 404, 690, 917; 252/301.6 R, 301.4 S; 427/248.1, 255.1, 255.2, 255.3, 70, 66, 126.3, 213, 215, 226

[56] References Cited

U.S. PATENT DOCUMENTS

| | | | |
|---|---|---|---|
| 3,264,133 | 8/1966 | Brooks | 117/33.5 |
| 3,306,768 | 2/1967 | Peterson | 117/106 |
| 4,097,776 | 6/1978 | Allinikov | 313/502 |
| 4,508,760 | 4/1985 | Olson et al. | 427/213.34 |
| 4,585,673 | 4/1986 | Sigai | 427/213 |
| 4,690,832 | 9/1987 | Yale | 427/65 |
| 4,855,189 | 8/1989 | Simopoulous | 428/690 |
| 4,990,371 | 2/1991 | Dutta et al. | 427/213 |
| 4,999,219 | 3/1991 | Klinedinst et al. | 427/69 |
| 5,080,928 | 1/1992 | Klinedinst et al. | 427/70 |
| 5,220,243 | 6/1993 | Klinedinst et al. | 313/502 |
| 5,244,750 | 9/1993 | Reilly et al. | 428/690 |

FOREIGN PATENT DOCUMENTS

| | | |
|---|---|---|
| 0160856 | 11/1985 | European Pat. Off. . |
| 0462504 | 12/1991 | European Pat. Off. . |
| 63-318092 | 6/1987 | Japan . |
| 62-177087 | 8/1987 | Japan . |
| WO91/10715 | 7/1991 | WIPO . |

OTHER PUBLICATIONS

Thornton, "Electroluminescence Maintenance," *Journal of Electrochem. Soc.,*, vol. 107, No. 11, Nov., 1960, pp. 895–907.

Thompson, et al., Air Force Technical Report AFF-DL-TR-68-103, Jul., 1968.

Zoltan Szepesi, Willi Lehmann, and David Leksell, "Preparation and Characteristics of White El Display Panels," Journal of Electronic Materials, vol. 7, No. 4, 1978, pp. 515–524.

*Primary Examiner*—D. S. Nakarani
*Assistant Examiner*—H. T. Lê
*Attorney, Agent, or Firm*—Gary L. Griswold; Walter N. Kirn; Robert W. Sprague

[57] ABSTRACT

Encapsulated electroluminescent phosphor particles and method for making same. The phosphor particles are encapsulated in a very thin oxide layer to protect them from aging due to moisture intrusion. The particles are encapsulated via a vapor phase hydrolysis reaction of oxide precursor materials at a temperature of between about 25° C. and about 170° C., preferably between about 100° C. and about 150° C. The resultant encapsulated particles exhibit a surprising combination of high initial luminescent brightness and high resistance to humidity-accelerated brightness decay.

27 Claims, 2 Drawing Sheets

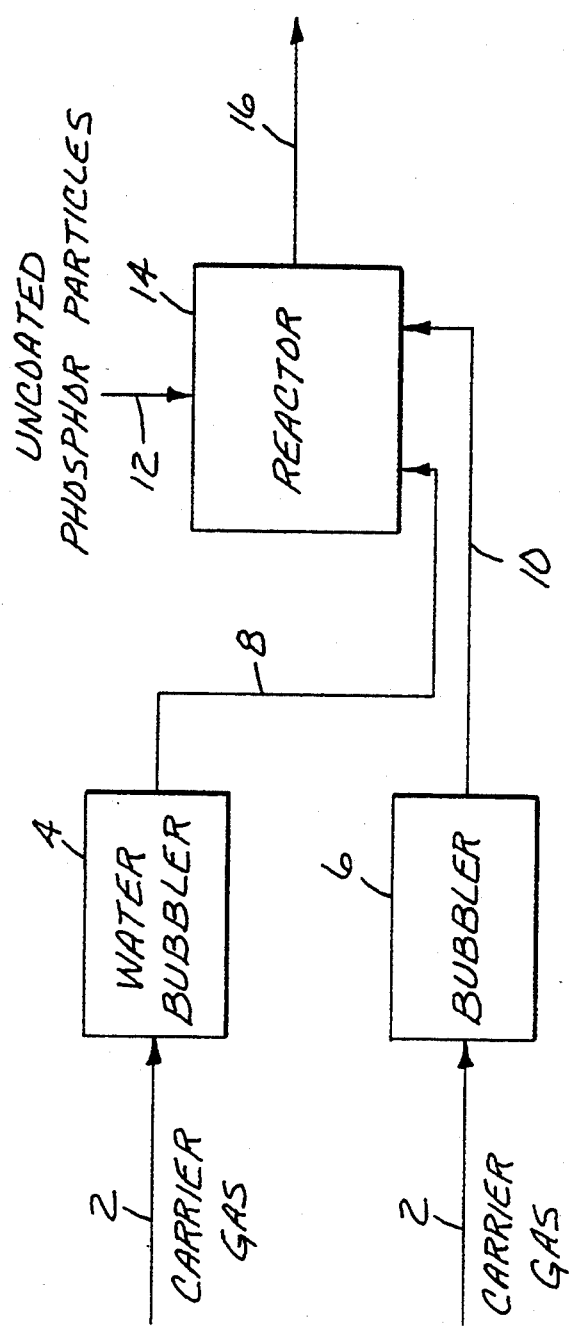
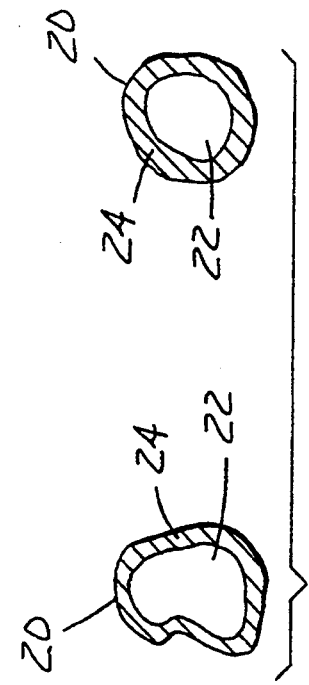

ENCAPSULATED ELECTROLUMINESCENT PHOSPHOR PARTICLES

CROSS-REFERENCE TO RELATED APPLICATION

This application is a division of application Ser. No. 07/514,440, filed Apr. 25, 1990, now issued as U.S. Pat. No. 5,156,885.

FIELD OF THE INVENTION

The present invention relates to electroluminescent phosphor particles, particularly encapsulated phosphor particles which exhibit strong moisture resistance and high electroluminescent brightness. The present invention also relates to a method for making such encapsulated phosphor particles.

BACKGROUND

Phosphor particles are used in a variety of applications such as flat panel displays and decorations, cathode ray tubes, and fluorescent lighting fixtures. Luminescence or light emission by phosphor particles may be stimulated by application of heat (thermoluminescence), light (photoluminescence), high energy radiation (e.g., x-rays or e-beams), or electric fields (electroluminescence).

Electroluminescent ("EL") phosphors are of particular commercial importance. The luminescent brightness and "maintenance" of such brightness of such phosphors are two important criteria for characterizing phosphor particles. Luminescent brightness is typically reported as a quantity of light emitted by the subject phosphor when excited. When reported in absolute brightness, e.g., in foot-Lamberts ("ft-L"), the conditions under which the phosphor is excited should also be reported as the absolute luminescent brightness of a given phosphor typically depends upon a combination of several factors. For instance, the absolute brightness of an electroluminescent phosphor should be reported with specified voltage and frequency of the applied electric field and temperature of the phosphor. The luminescent brightness attained is also dependent in part upon the physical characteristics and specifications of the test device used to measure the magnitude of emitted light. A typical test device possesses many of the same members as the thick film electroluminescent devices discussed below. with regard to accurately determining the absolute brightness of a subject phosphor, important characteristics thereof include the thickness of the phosphor layer, the concentration or loading of the phosphor particles in the dielectric matrix, the characteristics of the particular dielectric matrix material, and the transparency of the front electrode. Because of the sensitivity of phosphor emission brightness to varying conditions of excitement, the brightness of phosphors are more typically reported as relative brightnesses rather than as absolute brightness. "Maintenance" refers to the rate at which phosphors lose brightness during operation. As discussed by Thornton in *Electroluminescent Maintenance,* Jour. of Electrochem. Soc., pp 895-907, Vol. 107, No. 11, Nov. 1960, such a decrease in brightness with operating time is a typical characteristic of phosphors. Furthermore, the rate of decay is substantially increased if the phosphor particles are subjected to conditions of high humidity while being operated. "Atmospheric water vapor is perhaps the most important adverse influence on electroluminescence maintenance from the point of view of practical application." Ibid. This effect of moisture or high humidity is referred to herein as "humidity-accelerated decay".

Decay characteristics observed during operation at zero relative humidity are referred to as the intrinsic maintenance characteristics or intrinsic decay of the subject phosphor. The intrinsic decay varies with operating conditions such as voltage, frequency, and temperature, but is essentially reproducible for a given phosphor for a given set of operating conditions. As noted by Thornton, operation in high humidity, e.g., relative humidity of greater than about 80 percent can increase the decay rate by a factor of 10 or more with respect to the subject phosphor's intrinsic decay.

Particulate EL phosphors are most commonly used in thick film constructions. These devices typically include a layer of an organic dielectric matrix, e.g., polyester, polyethylene terephthalate, cellulosic materials, etc., preferably having a high dielectric constant, loaded with phosphor particles, e.g., sulfide-based phosphor particles. Such layers are typically coated on a plastic substrate having a transparent front electrode. A rear electrode, e.g., an aluminum foil or screen printed silver ink, is typically applied to the back side of the phosphor layer. When an electric field is applied across the electrodes, the proximate portions of the layer emit light as the phosphor particles therein are excited. Such constructions may further comprise optional dielectric layers between the phosphor layer and rear electrodes.

Organic matrices and coatings can temporarily delay or slow the rate of humidity-accelerated decay, however, after moisture permeates the matrix or coating, rapid loss of luminescent brightness is typically exhibited. Organic matrices and substrate materials have typically been insufficiently effective in preventing diffusion of water vapor to the phosphor particles, and have accordingly been ineffective in preventing subsequent decay of brightness. For this reason, thick film electroluminescent devices are typically encased in relatively thick, e.g., 25 to 125 microns, envelopes of moisture-resistant materials such as fluorochlorocarbon polymers such as ACLAR Polymers from Allied Chemical. Some of the problems with such envelopes include typically substantial expense, unlit borders, and potential for delamination, e.g., under heat.

U.S. Pat. No. 4,097,776 (Allinikov) discloses electroluminescent phosphors coated with a liquid crystal in a solution-based technique. U.S. Pat. No. 4,508,760 (Olson et al.) discloses encapsulation of electroluminescent phosphors via vacuum deposition of certain polymers.

It is also known to encapsulate phosphor particles in inorganic coatings, e.g., oxide coatings. U.S. Pat. No. 3,264,133 (Brooks) discloses the deposition of coatings such as titania ($TiO_2$) on phosphor particles by washing the particles in a predominantly alcohol solution of a halogen-containing constituent, e.g., titanium tetrachloride, and then drying and firing the particles.

Vapor phase reaction and deposition processes have been used to coat phosphor particles with inorganic coatings. Such techniques are typically considered as superior in providing more complete, uniform, and defect-free coatings. Phosphor particles encapsulated with such techniques have exhibited substantial resistance to humidity-accelerated decay. However, significant reductions in humidity-accelerated decay of luminescent brightness have been obtained only in conjunction with greatly diminished initial luminescent brightness and in some instances, undesirable color shift of the light emitted by the encapsulated phosphor particles.

For instance, U.S. Pat. No. 4,855,189 (Simopoulous et el.) discloses encapsulation of phosphor particles with $SiO_2$ via a chemical vapor deposition process ("CVD") wherein phosphor particles are subjected to a temperature of about 490° C. and an atmosphere of oxygen and silane gas while being agitated. Phosphor particles encapsulated in accordance with this reference have been found to exhibit a substantial reduction in initial electroluminescent brightness for given excitement conditions.

Air Force Technical Report AFFDL-TR-68-103 (Thompson et el., July 1968) discloses vapor phase encapsulation of electroluminescent phosphor particles for the purpose of attempting to improve performance at elevated temperatures. That reference discloses use of a fluidized bed chemical vapor deposition ("CVD") process to deposit several different oxide coatings onto zinc sulfide-based phosphors. Oxide coatings were deposited from a variety of precursor materials at furnace settings of about 200° C. to about 500° C. The reactor temperature profile was such that the maximum temperature within the reaction zone was typically 100° C. higher than the nominal temperature setting, accordingly, the maximum temperatures within the reactor ranged upward of about 300° C. for the various deposition runs disclosed therein. Titania-coated zinc sulfide/zinc selenide phosphors were found to have a reduced humidity-accelerated decay, but the initial luminescent brightness of the encapsulated phosphors was only about 25 percent that of the original material in uncoated form.

The prior art does not disclose a technique for encapsulating phosphor particles that provides desired moisture-resistance coupled with high levels of initial luminescent brightness relative to the initial luminescent brightness of the uncoated phosphor particles.

SUMMARY OF INVENTION

The present invention provides novel encapsulated phosphor particles having thin, substantially transparent oxide coatings which exhibit unexpectedly high initial luminescent brightness coupled with surprising resistance to humidity-accelerated decay of luminescent brightness. The present invention also relates to a novel method for making such encapsulated phosphor particles utilizing relatively low temperature vapor phase hydrolysis reactions and deposition processes.

Briefly summarizing, encapsulated phosphor particles of the invention each comprise a particle of luminescent phosphor which is essentially completely encapsulated within a substantially transparent, continuous oxide coating. In accordance with the invention, the encapsulated particle has an electroluminescent brightness which is equal to or greater than 50 percent of the luminescent brightness of the original uncoated phosphor particle when excited in the same manner. Further, encapsulated phosphor particles of the invention exhibit substantially reduced humidity-accelerated brightness decay, i.e., their brightness decay characteristics in operating conditions of 95 percent or more relative humidity are substantially the same as their intrinsic decay characteristics, such that the percent of electroluminescent brightness retained following 100 hours of operation in an environment having a relative humidity of at least 95 percent is greater than about 70 percent, preferably greater than about 80 percent, and most preferably greater than about 90 percent, of the intrinsic brightness of the encapsulated phosphor particles retained following 100 hours operation under substantially the same operating conditions of temperature, and voltage and frequency of applied electric field. Intrinsic brightness of the encapsulated phosphor particles refers to the electroluminescent brightness of such particles when operated under a relative humidity of less than 10 percent.

In brief summary, the novel method of the invention comprises:

a) providing an agitated bed of phosphor particles;

b) heating the bed to a temperature of between about 25° C. and about 170° C.;

c) exposing the bed to one or more vapor phase oxide precursors such that the precursors chemically react and form hermetic, substantially transparent oxide coatings on the surfaces of the particles, thereby yielding essentially encapsulated phosphor particles; and d) cooling the resultant encapsulated particles.

The initial electroluminescent brightness of encapsulated phosphor particles of the invention is typically at least about 50 percent of the initial luminescent brightness of the phosphor particles in their initial uncoated state, preferably at least about 70 percent of that initial brightness, and most preferably at least about 80 percent of that initial brightness. The brightness decay during operation while exposed to high humidity, e.g., relative humidity of over 80 percent, is much less than that of the uncoated phosphor under the same conditions, and is typically substantially the same as the intrinsic decay of the subject phosphor. Phosphor particles of the invention provide a surprising combination of high initial electroluminescent brightness and humidity resistance, a combination which was heretofore unavailable.

BRIEF DESCRIPTION OF DRAWING

The invention will be further explained with reference to the drawing, wherein:

FIG. 1 is a schematic illustration of one embodiment of the method for making encapsulated phosphor particles in accordance with the present invention;

FIG. 2 is a cross-sectional illustration of phosphor particles of the invention.

Figure 3:
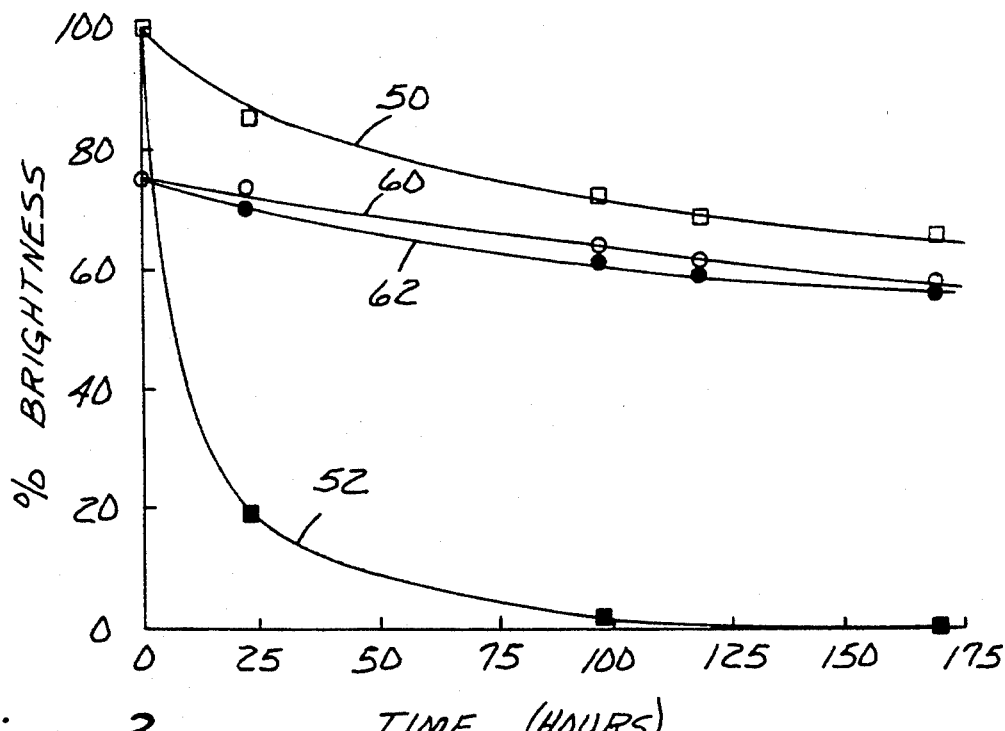
FIGS. 3 and 4 are graphical illustrations of the decay characteristics of illustrative encapsulated phosphor particles of the invention and the decay characteristics of uncoated phosphor particles of the same composition.

These figures are idealized and are intended to be merely illustrative and non-limiting.

DETAILED DESCRIPTION OF ILLUSTRATIVE EMBODIMENTS

Phosphor particles used in the invention comprise zinc sulfide-based electroluminescent materials. Such phosphors are well-known and commonly include one or more of such compounds as copper sulfide (CuS), zinc selenide (ZnSe), and cadmium sulfide (CdS) in solid solution within the zinc sulfide crystal structure or as second phases or domains within the particle structure.

Phosphors commonly contain moderate amounts of other materials such as dopants, e.g., bromine, chlorine, manganese, silver, etc., as color centers, as activators, or to modify defects in the particle lattice to modify properties of the phosphor as desired. Phosphors used in the present invention may be formulated in accordance with conventional practices.

Good results have been obtained with several commercially available phosphors including Sylvania Type 723, 728, and 830 Phosphors. Sylvania Type 723 is believed to be a copper-activated zinc sulfide phosphor which provides green fluorescence under an applied electric field. Sylvania Type 728 is believed to be a copper-activated zinc sulfide phosphor which provides green fluorescence under an applied electric field. Sylvania Type 830 is believed to be a blend of copper/manganese-activated zinc sulfide and copper-activated zinc sulfide which provides a white fluorescence under an applied electric field.

Phosphor particles used herein may be of many sizes, typically depending to large extent on the particular application. Phosphor particles having average particle diameters of between about 1 and about 50 microns, preferably between about 10 and 40 microns, are typically useful for screen printed and roll coated panels, for CRT screens, light bulbs, as well as many other applications. Phosphor particles which are too large may interfere with formation of very thin phosphor layers, may result in grainy or nonuniform light output, and typically tend to settle too quickly from suspensions during device fabrication. Phosphor particles which are too small may tend to degrade more rapidly during use due to increased relative surface area, may tend to agglomerate so as to interfere with free flow characteristics, and may be difficult to mix with binders in desirably high loadings.

Encapsulated phosphor particles of the invention are essentially completely coated with a substantially continuous coating of one or more oxides. As used herein, "oxide coating" means a material made up primarily of metal cations and oxygen, but which may contain minor amounts of other elements and compounds originating in the precursor materials or phosphor particles, which can be generated in coating form on phosphor particles under the conditions described herein. Advantageous results have been obtained with coatings of titania ($TiO_2$) and titania/silica $TiO_2/(SiO_2)$. It is believed that useful results may also be obtained with other oxides formed from precursors in low temperature reactions such as silica ($SiO_2$), alumina ($Al_2O_3$), tin oxide ($SnO_2$), zirconia ($ZrO_2$), etc., and similarly formed compound oxides such as mullite ($3Al_2O_3 \cdot 2Si_2$).

The oxide coating is substantially transparent and is typically between about 0.1 and 3.0 microns thick, preferably between about 0.1 and about 0.5 microns thick. Coatings which are too thin may tend to provide insufficient impermeability to moisture. Coatings which are too thick may tend to be less transparent and result in reduced brightness.

As mentioned above, the novel method of the invention comprises:
a) providing an agitated bed of phosphor particles;
b) heating the bed to a temperature of between about 25° C. and about 170° C., preferably between about 100° C. and about 150° C.;
c) exposing the bed to one or more vapor phase oxide precursors such that the precursors chemically react to form oxides in the presence of the phosphor particles and deposit on the surfaces of the phosphor particles an essentially continuous, substantially transparent oxide coating, thereby yielding essentially encapsulated phosphor particles; and
d) cooling the resultant encapsulated particles. An illustrative embodiment of the novel process of the invention is shown schematically in FIG. 1.

During manufacture, phosphor particles may typically be washed to remove residual amounts of dopants left on the surfaces thereof, e.g., copper sulfide may be removed with a potassium cyanide solution. Generally, commercially available phosphor particles are suitable for use in the present invention in the condition supplied by the manufacturer without any further special surface preparation.

Uncoated phosphor particles 12 are placed in reactor 14 and heated to between about 25° C. and about 170° C., preferably between about 100° C. and 150° C. In order to form substantially continuous coatings covering essentially the entire surfaces of the phosphor particles, the particles are preferably agitated while in the reaction chamber. Illustrative examples of useful methods for agitating the phosphor particles include shaking, vibrating, or rotating the reactor, stirring the particles, or suspending them in a fluidized bed. In such reaction chambers, the particles may be agitated by many different ways such that essentially the entire surface of each particle is exposed and the particles and reaction precursors may be well intermixed. Typically, a preferred reaction chamber is a fluidized bed reactor. Fluidizing typically tends to effectively prevent agglomeration of the particles, achieve uniform mixing of the particles and reaction precursor materials, and provide more uniform reaction conditions, thereby resulting in highly uniform encapsulation characteristics.

Although not required in many instances, it may be desired when using phosphor particles which tend to agglomerate to add fluidizing aids, e.g., small amounts of fumed silica. Selection of such aids and of useful amounts thereof may be readily determined by those with ordinary skill in the art.

Precursor materials in vapor phase are then added to the reactor. The present invention utilizes a vapor phase hydrolysis reaction to form a coating of oxide material on the surfaces of the phosphor particles thereby encapsulating them. Such process is sometimes referred to as a chemical vapor deposition ("CVD") reaction. The following is an illustrative reaction:

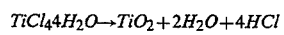

$$TiCl_4 + 4H_2O \rightarrow TiO_2 + 2H_2O + 4HCl$$

In the illustration, water vapor and titanium tetrachloride are considered oxide precursor materials.

One technique for getting the precursor materials into vapor phase and adding them to the reaction chamber is to bubble a stream of gas, preferably inert, referred to herein as a carrier gas, through a solution or neat liquid of the precursor material and then into the reaction chamber. Illustrative examples of inert gases which may be used herein include argon and nitrogen. Oxygen and/or air may also be used. An advantage of this technique is that the carrier gas/precursor streams may be used to fluidize the phosphor particles in the reaction chamber, thereby facilitating the desired encapsulation process. In addition, such a technique provides means for readily controlling the rate of introduction of the precursor materials into the reactor. Referring again to FIG. 1, carrier gas 2 is bubbled through water bubbler 4, to produce water vapor-containing precursor stream 8, and carrier gas 2 is also bubbled through titanium tetrachloride bubbler 6, to produce titanium tetrachloride-containing precursor stream 10. Precursor streams 8 and 10 are then transported into reactor 14.

Precursor flow rates are adjusted to provide an adequate deposition rate and to provide an oxide coating of desired quality and character. Flow rates are adjusted such that the ratios of precursor materials present in the reactor chamber promote oxide deposition at the surface of the phosphor particles substantially without formation of discrete, i.e., free floating, oxide particles, elsewhere in the chamber. For example, when depositing coatings of titania from titanium tetrachloride and water, a high ratio of tetrachloride molecules to water molecules is maintained such that most of the available water in the reaction chamber remains absorbed on the surfaces of the phosphor particles and little is in free state elsewhere in the chamber. Such a ratio is also believed to promote the formation of more anhydrous titania films which are believed to provide optimum protection against humidity-accelerated decay.

Optimum flow rates for a particular application typically depend in part upon the temperature within the reaction chamber, the temperature of the precursor streams, the degree of particle agitation within the chamber, and the particular precursors being used, but useful flow rates may be readily determined with trial and error. In preferred embodiments, the flow rate of carrier gas used to transport the precursor materials to the reaction chamber is sufficient to agitate the phosphor particles as desired and also transport optimal quantities of precursor materials to the chamber.

Preferably, the precursor materials have sufficiently high vapor pressures that sufficient quantities of precursor material will be transported into the reactor for the hydrolysis reaction and coating process to proceed at a conveniently fast rate. For instance, precursor materials having higher vapor pressures will typically provide faster deposition rates than will precursor materials having lower vapor pressures, thereby enabling the use of shorter encapsulation times. Precursor sources may be heated to increase the vapor pressure of the material, however, this may necessitate heating of tubing or other means used to transport the precursor material to the reactor so as to prevent condensation between the source and the reactor. In many instances, precursor materials will be in the form of neat liquids at room temperature. In some instances, the precursor materials may be available as sublimable solids.

Precursor materials that are capable of forming hermetic oxide coatings via hydrolysis reactions at low temperatures, e.g., below about 170° C. and preferably below about 150° C., are preferred. Advantageous results have been obtained with titanium tetrachloride or silicon tetrachloride, and water as precursor materials. In addition to such metal chlorides, useful results are also expected with metal alkoxides, e.g., titanium isopropoxide, silicon ethoxide, and zirconium n-propoxide.

Preferably, the mutually reactive precursor materials, e.g., $TiCl_4$ and $H_2O$, are not mixed prior to being added to the reactor in order to prevent premature reaction within the transport system. Accordingly, multiple gas streams into the reactor chamber are typically provided.

The temperature of the reactor is maintained at between about 25° C. and about 170° C., and preferably between about 100° C. and about 150° C. It has been observed that encapsulation processes performed at temperatures within this range provide deposition of desired hermetic coatings that provide desired protection against humidity-accelerated decay while avoiding intrinsic thermal damage or adverse thermochemical reactions at the surfaces of the particles which cause undesirable loss of initial brightness. Encapsulation processes which are performed at temperatures which are too low may tend to result coatings which do not provide desired resistance to humidity-accelerated decay. Such coatings are not sufficiently moisture impermeable, a result it is believed of having a more open or more hydrated structure. Encapsulation processes which are performed at temperatures which are too high may result in decreased electroluminescent brightness, undesirable changes or shifts in the color of the light emitted by the subject phosphor, or degradation of the intrinsic decay characteristics of the subject phosphor material.

Although it has been suggested in the prior art that exposing phosphor particles to high temperatures, e.g., above about 350° C., tends to reduce the initial luminescent brightness thereof, it has been found that phosphor particles may be degraded by exposure to lower temperatures, e.g., about 170° to about 200° C., under certain conditions. While I do not wish to be bound by this theory, it is postulated that phosphor materials are not sensitive only to the temperatures to which they are exposed, but that one or more effects caused by exposure of the particles to certain compositions, e.g., exposure to certain compounds, also exist, and that such effects are also dependent upon temperature. A specific mechanism is not yet determined, but it is believed that the surface of the phosphor particles may undergo some change by exposure to such agents as hydrochloric acid such as is generated during vapor generation and deposition of titania coatings from titanium tetrachloride which affects the luminescent brightness of the resultant encapsulated particle.

Accordingly, encapsulation of phosphor particles as described herein is preferably performed at temperatures between about 25° C. and about 170° C., preferably between about 100° C. and about 150° C. Referring again to FIG. 1, following encapsulation, encapsulated phosphor particles 16 of the invention are removed from reactor 14. As illustrated in FIG. 2, typically encapsulated phosphor particles 20 of the invention consist essentially of particle 22 of phosphor material which is essentially completely encapsulated within substantially transparent, continuous oxide coating 24.

Encapsulated phosphor particles of the invention provide both high resistance to humidity-accelerated decay and substantially retain their intrinsic properties. For instance, there is typically little or no shift in the emission spectra of phosphor particles encapsulated as taught herein, such particles typically retain a substantial portion of their initial luminescent brightness, and the intrinsic decay characteristics are typically similar to or even better than those of the uncoated phosphor particles.

The resistance to humidity-accelerated decay is typically such that the rate of brightness loss when operated while directly exposed to high humidity, e.g., a relative humidity of greater than 95 percent, is substantially no greater than the intrinsic brightness loss exhibited during operation in a dry environment, e.g., a relative humidity of less than about 10 percent. In an illustrative example, the luminescent brightness of an encapsulated phosphor of the invention, after operation for 100 hours in an environment having a relative humidity of at least 95 percent, was over 90 percent of the luminescent brightness of similarly encapsulated phosphor particles after operation for 100 hours in an environment having a relative humidity of less than 10 percent.

FIG. 3 is a graphical illustration of the relative absolute electroluminescent brightness versus time of operation of illustrative encapsulated phosphor particles of the invention and the same phosphor material in uncoated state. In FIG. 3, the difference in position on the Y (vertical) axis is proportional to the difference in absolute brightness of the subject phosphors. Each curve was derived from the average of several samples of the indicated type. Curve 50 represents the decay characteristics of uncoated phosphor material operated in a dry environment (relative humidity less than 10 percent) and Curve 52 represents the decay characteristics of uncoated phosphor material operated in a high humidity environment (relative humidity over 95 percent). The substantial difference between Curve 50 and Curve 52 represents humidity-accelerated brightness decay of the uncoated phosphor material. Curve 60 represents the decay characteristics of encapsulated phosphor particles of the same phosphor material, encapsulated in accordance with the invention, operated in the same dry environment. Curve 62 represents the decay characteristics of encapsulated phosphor particles of the same phosphor material, encapsulated in accordance with the invention, operated in the same humid environment described above. The small differential between Curves 60 and 62 indicates that humidity-accelerated brightness decay has been substantially eliminated by encapsulation in accordance with the present invention. Curves 60 and 62 begin at lower absolute brightness, representing the reduction in initial electroluminescent brightness (about 75 percent of that of the uncoated phosphor material) resulting from the encapsulation process. Such performance is substantially better than that achieved with previously known encapsulation techniques. For instance, phosphor particles encapsulated in accordance with U.S. Pat. No. 4,855,189 have been found to have an initial brightness of only about 30 percent of that of the uncoated phosphor.

Figure 4:
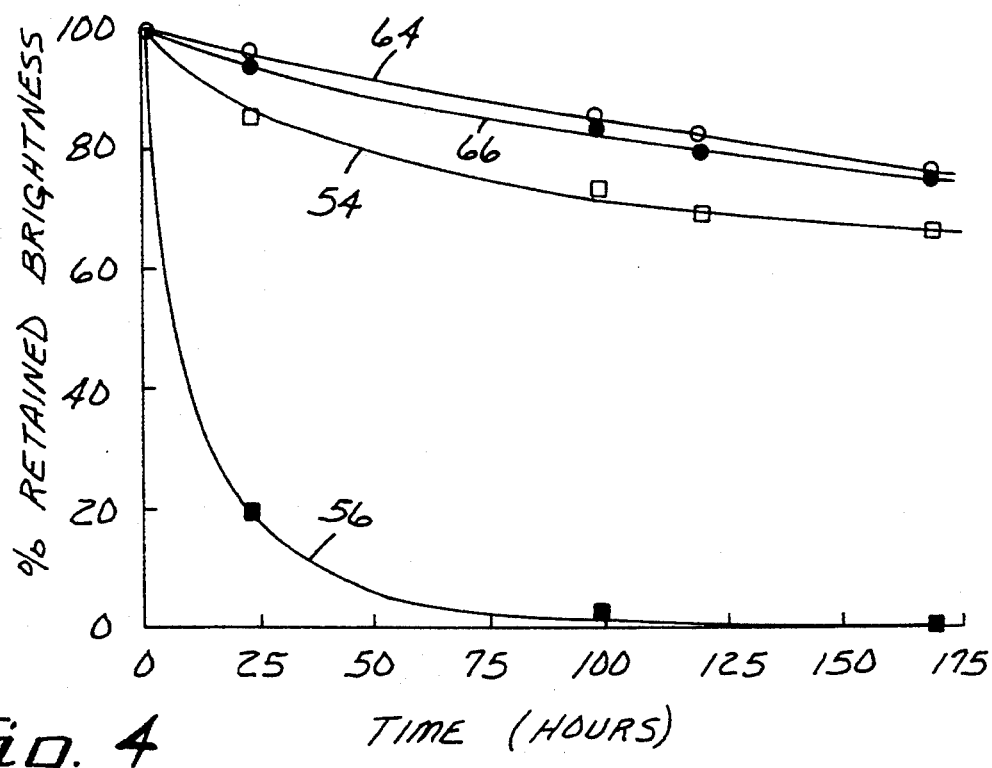

FIG. 4 is a graphical illustration of the percent of retained luminescent brightness of each of the subject phosphors versus time of operation of encapsulated phosphor particles of the invention and the same phosphor material in an uncoated state. Each curve was derived from the average of several of samples of the indicated type. Curve 54 represents the decay characteristics of uncoated phosphor material operated in a dry environment (relative humidity less than 10 percent) and Curve 56 represents the decay characteristics of uncoated phosphor material operated in a high humidity environment (relative humidity over 95 percent). Curve 64 represents the decay characteristics of encapsulated phosphor particles of the same phosphor material, encapsulated in accordance with the invention, operated in the same dry environment. Curve 66 represents the decay characteristics of encapsulated phosphor particles of the same phosphor material, encapsulated in accordance with the invention, operated in the same humid environment.

In accordance with the present invention, encapsulated phosphor particles may be made which exhibit the exceptional resistance to humidity-accelerated decay described above and also provide high initial electroluminescent brightness. For instance, encapsulated phosphor particles of the invention can be made with Sylvania Type 723 Phosphor which exhibit an initial electroluminescent brightness of at least about 15 foot-Lamberts, preferably at least about 20 foot-Lamberts, most preferably at least about 23 foot-Lamberts, as measured by providing a 100 micron thick layer of the encapsulated phosphor particles in dielectric oil (castor oil) with an ITO on glass electrode (transmission about 90 percent) that had been sprayed with substantially transparent acrylic coating about 1000 angstroms thick thereover, the layer containing 66 weight percent of phosphor particles, applying an electric field having a voltage of about 600 volts and a frequency of about 500 Hertz, and measuring the magnitude of light emitted through the electrode. In an uncoated state, Sylvania Type 723 Phosphor was found to exhibit an initial electroluminescent brightness of about 29.5 foot-Lamberts. In an uncoated state, Sylvania Type 728 Phosphor has been found to exhibit an initial electroluminescent brightness of about 31.5 foot-Lamberts, and encapsulated phosphor particles of the invention having brightnesses of at least about 16, preferably 22, and most preferably 25 foot-Lamberts can be made therewith. In an uncoated state, Sylvania Type 830 Phosphor has been found to exhibit an initial electroluminescent brightness of about 11 foot-Lamberts, and encapsulated phosphor particles of the invention having brightnesses of at least about 6, preferably 8, and most preferably 9 foot-Lamberts can be made therewith.

EXAMPLES

The invention will be further explained by the following illustrative examples which are intended to be nonlimiting. Unless otherwise indicated, all amounts are expressed in parts by weight. Flow rates refer to the metered volume of carrier gas (nitrogen gas) through the indicated solutions.

ENCAPSULATION PROCESS

Fluidized bed reactors consisting of glass-frit type funnels with a single bottom inlet and size D frit were used. As indicated below, 20 millimeter and 40 millimeter reactors modified for oil bath immersion or for heating with nichrome wire were used. The 20 millimeter reactors were used with a single gas inlet tube and the 40 millimeter reactors with two gas inlet tubes. The gas inlet tubes were glass tubes, 10 millimeters in diameter, with size C glass frits which were inserted into the fluidized bed extending from the top of the funnel to introduce carrier gas and metal tetrachloride vapors into the reaction zone. A separate tube was connected to the bottom of the reactor and water vapor introduced into the reactor therethrough.

Bubbler sizes were about 300 milliliters for the 20 millimeter diameter reactors and 800 milliliters for the 40 millimeter diameter reactors.

Carrier gas and water vapor were passed through the funnel frit supporting the phosphor particles. Reagent grade neat liquids of titanium tetrachloride and silicon tetrachloride from Aldrich Chemical Company were used as indicated.

BRIGHTNESS

The electroluminescent brightness of phosphor samples was determined in test cells comprising a machined aluminum grid with 100 micron spacing between electrodes. Each cell was filled with a mixture of phosphor particles and liquid dielectric oil, Dow Corning FS1265 fluorosilicon oil or castor oil, at about 66 weight percent particles. A transparent top electrode comprising a sheet of indium tin oxide coated polyester film (DX ITO/PE from Southwall Corporation), having about 90 percent transmission, was mounted over the top of the grid. Tests were run under an applied electric field of 220 volts, 400 Hertz, in sealed battery jars maintained with water-saturated air, i.e., relative humidity of above 95 percent, or desiccant, i.e., relative humidity of below 10 percent. Samples were run continuously for at least 96 hours.

ABBREVIATIONS

The following abbreviations are used in reporting the examples:

| Abbrev. | Meaning |
| --- | --- |
| IB | Initial Brightness of phosphor sample at beginning of brightness test as percentage of initial luminescent brightness of same phosphor in fresh, uncoated condition. |
| RB | Retained Brightness of phosphor sample after about 96 hours continuous operation of brightness cell as percentage of Initial Brightness of same phosphor. |
| RH | Relative Humidity under which luminescent brightness was determined. |
| SEM | Scanning Electron Microscope. |

PHOSPHOR SPECIFICATIONS

Commercially available Sylvania type 723, 723RB, 728, and 830 Phosphors were used in the Examples as indicated. The physical properties of those phosphors are reported by the seller as follows:

| Type | Size Distrib.[1] | | | | Density[2] | | Color[4] |
| --- | --- | --- | --- | --- | --- | --- | --- |
| | 25% | 50% | 75% | SS[3] | M | B | |
| 723 | 22 | 28 | 35 | 22 | 4.1 | 1.94 | Light green |
| 728 | 24 | 31 | 38 | 23 | 4.1 | 1.94 | Light green |
| 830 | 22 | 28 | 35 | 22 | 4.1 | 1.94 | Light tan |

[1]Particle Size Distribution - Coulter Counter, size in micrometers at listed percentiles.
[2]Material ("M") and Bulk ("B") Density in grams/cubic centimeter.
[3]Fisher Sub-Sieve Size.
[4]Body color.

Type 723 RB Phosphor has been observed to exhibit a greater shift to blue emission when high frequency electric fields are applied, but is otherwise believed to be substantially similar to Type 723 Phosphor. Type 723RB Phosphor is reported to have the same physical properties as listed above for Type 723.

EXAMPLE 1

A 20 millimeter diameter reactor heated with nichrome wire was used to encapsulate 20 grams of Sylvania Type 723 Phosphor with titania.

During encapsulation the temperature was maintained at 137° C.+8° C. The flow rates of dry nitrogen through the water and titanium bubblers were 100 centimeters$^3$/minute and 260 centimeters$^3$/minute, respectively. The encapsulation process was run for 4 hours. Small samples were removed from the reactor every hour and immersed in 0.1 molar silver nitrate solution and observed. The uncoated phosphor turned black within a few minutes as silver sulfide formed at the surface of the particles. Phosphor particles removed after 1 hour turned gray, indicating incompletely encapsulated particles. Phosphor particles removed after 2 or more hours were unaffected by the solution, indicating that they were essentially completely encapsulated with a coating which was impermeable to the solution. Negligible change in coloration of the immersed particles was observed over a period of several weeks.

SEM analysis revealed that the phosphor particles had coating thicknesses of between 0.2 and 0.4 microns. The coatings appeared to completely cover the surfaces of the particles and no pores were visible.

Brightness results of the encapsulated phosphor particles, identified as Sample 1, are tabulated in Table I below. The corresponding results for untreated phosphor particles, identified as sample A are also listed for comparison.

TABLE 1

| Sample | RH | IB | RB |
| --- | --- | --- | --- |
| A | <10 | 100 | 75 |
| A | >95 | 100 | 0 |
| 1 | <10 | 77 | 88 |
| 1 | >95 | 77 | 88 |

The Retained Brightness of Sample A differed markedly between operation in humid conditions and operation in dry conditions. However, in Sample 1 it was substantially the same, indicating high resistance to humidity-accelerated decay. In other tests, operation of encapsulated phosphor particles of the invention in humid environments was found to have resulted in a somewhat lower Retained Brightness than operation in dry environments, but in all instances the differential was small and high resistance to humidity-accelerated decay was obtained.

EXAMPLES 2-7

Several 20 gram batches of Sylvania No. 723 Phosphor were coated with titania as in Example 1, except the average temperature and flow rates were varied as indicated. The reaction conditions and brightness properties of the resultant encapsulated phosphor particles are tabulated in Table II.

TABLE II

| Sample | Temp[1] | Water[2] | TiCl$_4$[3] | IB | RB |
| --- | --- | --- | --- | --- | --- |
| 2 | 130 | 100 | 220 | 77 | 85 |
| 3 | 140 | 100 | 220 | 73 | 82 |
| 4 | 150 | 100 | 220 | 69 | 59 |
| 5 | 140 | 200 | 120 | 72 | 18 |
| 6 | 140 | 170 | 120 | 68 | 56 |
| 7 | 140 | 120 | 200 | 73 | 86 |

[1]Average reaction temperature in °C.
[2]Flow rate through water bubbler in centimeters$^3$/minute.
[3]Flow rate through TiCl$_4$ bubbler in centimeters$^3$/minute.

Examples 2-4 illustrate a tendency toward reduced initial luminescent brightness with increasing reaction temperature, indicating that minimization of reaction temperature below certain levels is important for maintaining high initial luminescent brightness, Examples 5-7 illustrate a tendency toward increased retention of luminescent brightness with higher ratios of titanium tetrachloride to water precursor flows. This effect may have been observed because the resultant coatings made with lower ratios were less anhydrous or because the limited amount of available titanium tetrachloride resulted in slower reaction and thinner resultant coating, which in thicker form might have provided better resistance to humidity-accelerated decay.

EXAMPLES 8-10

Several batches of Sylvania No. 723 Phosphor were encapsulated as in Example 1 except (1) an oil bath was used to maintain and average reaction temperature of about 140° C.+5° C. and (2) the chloride bubbler contained a mixture of titanium tetrachloride and silicon tetrachloride in the indicated volume ratio. The flow rate through the water bubbler was 100 centimeters$^3$/minute and the flow rate through the chloride bubbler was 220 centimeters$^3$/minute.

TABLE III

| Sample | Ratio | IB | RB |
| --- | --- | --- | --- |
| 8 | 40/60 | 82 | 89 |
| 9 | 60/40 | 87 | 88 |
| 10 | 80/20 | 80 | 83 |

EXAMPLES 11-15

Several batches of Sylvania No. 723 Phosphor were encapsulated as in Example 1 except that a 40 millimeter diameter reactor and 100 grams or 200 grams as indicated of phosphor were used, and the reaction was continued for the indicated time. Nitrogen flow rates through the water and titanium tetrachloride bubblers were 1300 cubic centimeters/minute and 350 cubic centimeters/minute, respectively.

TABLE IV

| Sample | Temp[1] | Amount[2] | Time[3] | IB |
| --- | --- | --- | --- | --- |
| 11 | 200 | 200 | 9 | 14 |
| 12 | 187 | 100 | 7 | 22 |
| 13 | 170 | 100 | 5 | 32 |
| 14 | 157 | 100 | 5 | 60 |
| 15 | 150 | 100 | 5 | 67 |

[1]Average reaction temperature in °C.
[2]Amount of phosphor in charge.
[3]Length of reaction time.

Examples 11-15 illustrate a tendency toward reduced initial luminescent brightness with increasing reaction temperature, indicating that minimization of reaction temperature below certain levels is important for maintaining high initial luminescent brightness.

EXAMPLES 16-25

Several 150 gram batches of Sylvania No. 723 Phosphor were encapsulated with titania using a 40 millimeter diameter reactor with 2 top gas inlets for oxide precursors. The temperature was controlled to ±2° C. of the indicated value using an oil bath.

TABLE V

| Sample | Temp[1] | A Flow[2] | B Flow[3] | Water[4] | Time[5] | IB | RB |
| --- | --- | --- | --- | --- | --- | --- | --- |
| 16 | 135 | 600 | 600 | 600 | 5.5 | 77 | 87 |
| 17 | 135 | 600 | 600 | 600 | 6.0 | 74 | 82 |
| 18 | 138 | 640 | 600 | 310 | 7.5 | 75 | 77 |
| 19 | 138 | 640 | 600 | 350 | 7.5 | 77 | 73 |
| 20 | 138 | 640 | 600 | 450 | 8.5 | 72 | 81 |
| 21 | 128 | 640 | 600 | 450 | 7.5 | 71 | 80 |
| 22 | 128 | 640 | 600 | 450 | 8.0 | 69 | 83 |
| 23 | 128 | 640 | 600 | 480 | 8.0 | 72 | 88 |
| 24 | 138 | 680 | 700 | 550 | 4.0 | 84 | 81 |
| 25 | 138 | 680 | 700 | 600 | 4.0 | 79 | 88 |

[1]Reaction temperature in °C.
[2]Flow rate through TiCl$_4$ bubbler A in centimeters$^3$/minute.
[3]Flow rate through TiCl$_4$ bubbler B in centimeters$^3$/minute.
[4]Flow rate through water bubbler in centimeters$^3$/minute.
[5]Reaction time in hours.

EXAMPLES 26-28

Three 20 gram batches of encapsulated phosphor particles were made using Sylvania No. 723, 728, and 830 Phosphor, respectively. In each case the phosphor particles were encapsulated using a 20 millimeter diameter reactor heated in an oil bath to an average temperature of about 128° C. The encapsulation reaction was run for 3.5 hours at the indicated flow rates.

TABLE VI

| Sample | Phosphor | TiCl$_4$[1] | Water[2] | IB | RB |
| --- | --- | --- | --- | --- | --- |
| 26 | 723RB | 200 | 105 | 72 | 83 |
| 27 | 728 | 220 | 110 | 68 | 83 |
| 28 | 830 | 220 | 110 | 84 | 81 |

[1]Flow rate through TiCl$_4$ bubbler in centimeters$^3$/minute.
[2]Flow rate through water bubbler in centimeters$^3$/minute.

Various modifications and alterations of this invention will become apparent to those skilled in the art without departing from the scope and spirit of this invention.

What is claimed is:

1. Encapsulated electroluminescent phosphor particles, each comprising a particle of zinc sulfide-based electroluminescent phosphor which is essentially completely encapsulated within a substantially transparent, continuous metal oxide coating;
    wherein said encapsulated phosphor particles have an initial electroluminescent brightness which is equal to or greater than about 50 percent of the initial electroluminescent brightness of the uncoated phosphor particles, and wherein the percent of luminescent brightness retained following 100 hours operation in an environment having a relative humidity of at least 95 percent is greater than about 70 percent of the intrinsic brightness retained following 100 hours operation, wherein initial change in electroluminescent brightness in an environment having a relative humidity of at least 95 percent and intrinsic brightness change are measured under substantially equivalent operating conditions of temperature, voltage, and frequency.

2. The encapsulated phosphor particles of claim 1 wherein the initial electroluminescent brightness of said particles is equal to or greater than about 70 percent of the initial luminescent brightness of the uncoated phosphor particles.

3. The encapsulated phosphor particles of claim 1 wherein the initial electroluminescent brightness of said particles is equal to or greater than about 80 percent of the initial luminescent brightness of the uncoated phosphor particles.

4. The encapsulated phosphor particles of claim 1 wherein said retained electroluminescent brightness is greater than about 80 percent of said intrinsic brightness.

5. The encapsulated phosphor particles of claim 1 wherein said retained electroluminescent brightness is greater than about 90 percent of said intrinsic brightness.

6. The encapsulated phosphor particles of claim 1 wherein said particles contain minor amounts of one or more of the following: cadmium, selenium, copper, bromine, chlorine, manganese, or silver.

7. The encapsulated phosphor particles of claim 1 wherein said particles are between about 1 and about 50 microns in diameter.

8. The encapsulated phosphor particles of claim 1 wherein said particles are between about 10 and about 40 microns in diameter.

9. The encapsulated phosphor particles of claim 1 wherein said coating is between about 0.1 and about 3.0 microns thick.

10. The encapsulated phosphor particles of claim 1 wherein said coating is between about 0.1 and about 0.5 microns thick.

11. The encapsulated phosphor particles of claim 1 wherein said coating comprises at least one of the following: titania, silica, alumina, tin oxide, zirconia, or mullite.

12. The encapsulated phosphor articles of claim 11 wherein said coating comprises at least one of titania or silica.

13. The encapsulated phosphor particles of claim 1 wherein said oxide coating was formed via the reaction of vapor phase metal oxide precursors at a temperature between about 25° C. and about 170° C.

14. The encapsulated phosphor particles of claim 13 wherein said oxide coating was formed via hydrolysis.

15. Encapsulated electroluminescent phosphor particles, each comprising a particle of zinc sulfide-based electroluminescent phosphor which is essentially completely encapsulated within a substantially transparent, continuous metal oxide coating;
wherein said encapsulated phosphor particles have an initial electroluminescent brightness which is equal to or greater than about 50 percent of the initial electroluminescent brightness of the uncoated phosphor particles, said metal oxide coating having been formed via hydrolysis of vapor phase metal oxide precursors.

16. Encapsulated electroluminescent phosphor particles, each comprising a particle of zinc sulfide-based electroluminescent phosphor which is essentially completely encapsulated within a substantially transparent, continuous metal oxide coating;
wherein said encapsulated phosphor particles have an initial electroluminescent brightness which is equal to or greater than about 50 percent of the initial electroluminescent brightness of the uncoated phosphor particles, and wherein the percent of electroluminescent brightness retained following 100 hours operation in an environment having a relative humidity of at least 95 percent is greater than about 70 percent of the intrinsic brightness retained following 100 hours operation, wherein initial brightness and change in electroluminescent brightness in an environment having a relative humidity of at least 95 percent and intrinsic brightness change are measured at ambient temperature under substantially equivalent operating conditions, including an applied electric field of 2.20 volts per micron and a frequency of 400 Hertz.

17. Encapsulated electroluminescent phosphor particles, each comprising a particle of zinc sulfide-based electroluminescent phosphor which is essentially completely encapsulated within a substantially transparent, continuous metal oxide coating formed via hydrolysis of vapor phase metal oxide precursors; and
wherein said encapsulated phosphor particles have an initial electroluminescent brightness which is equal to or greater than about 50% of the initial electroluminescent brightness of the uncoated phosphor particle, and the percent of electroluminescent brightness retained by the encapsulated phosphor particles following 100 hours operation in an environment having a relative humidity of at least 95 percent is greater than about 70 percent of the intrinsic brightness retained following 100 hours operation, the initial brightness and change in electroluminescent brightness in an environment having a relative humidity of at least 95 percent and intrinsic brightness change being measured under substantially the same operating conditions.

18. The encapsulated phosphor particles of claim 17 wherein the initial electroluminescent brightness of said particles is equal to or greater than about 70 percent of the initial electroluminescent brightness of the uncoated phosphor particles.

19. The encapsulated phosphor particles of claim 17 wherein the initial electroluminescent brightness of said particles is equal to or greater than about 80 percent of the initial electroluminescent brightness of the uncoated phosphor particles.

20. The encapsulated phosphor particles of claim 17 wherein said retained electroluminescent brightness is greater than about 80 percent of the retained intrinsic brightness.

21. The encapsulated phosphor particles of claim 17 wherein said retained electroluminescent brightness is greater than about 90 percent of the retained intrinsic brightness.

22. The encapsulated phosphor particles of claim 17 wherein said coating is between about 0.1 and about 3.0 microns thick.

23. The encapsulated phosphor particles of claim 17 wherein said coating is between about 0.1 and about 0.5 microns thick.

24. The encapsulated phosphor particles of claim 17 wherein the initial electroluminescent brightness of said particles is equal to or greater than about 70 percent of the initial electroluminescent brightness of the uncoated phosphor particles, and the retained electroluminescent brightness is greater than about 80 percent of the retained intrinsic brightness.

25. The encapsulated phosphor particles of claim 24 wherein the retained electroluminescent brightness is greater than about 90 percent of the retained intrinsic brightness.

26. The encapsulated particles of claim 24 wherein the initial electroluminescent brightness of said particles is equal to or greater than about 80 percent of the initial electroluminescent brightness of the uncoated phosphor particles.

27. The encapsulated phosphor particles of claim 17 wherein the initial electroluminescent brightness of said particles is equal to or greater than about 80 percent of the initial electroluminescent brightness of the uncoated phosphor particles, and the retained electroluminescent brightness is greater than about 90 percent of the retained intrinsic brightness.

* * * * *

UNITED STATES PATENT AND TRADEMARK OFFICE
CERTIFICATE OF CORRECTION

PATENT NO.: 5,418,062

DATED: May 23, 1995

INVENTOR(S): Kenton D. Budd

It is certified that error appears in the above-identified patent and that said Letters Patent is hereby corrected as shown below:

Column 14, line 38, after "initial" insert --brightness and--.

Column 15, line 22, after "hydrolysis" insert --of vapor phase precusors--.

Signed and Sealed this

Eleventh Day of March, 1997

Attest:

BRUCE LEHMAN

Attesting Officer    Commissioner of Patents and Trademarks